(12) United States Patent
Zhang

(10) Patent No.: US 11,146,220 B2
(45) Date of Patent: Oct. 12, 2021

(54) AMPLIFIER DEVICES WITH PHASE DISTORTION COMPENSATION AND METHODS OF MANUFACTURE THEREOF

(71) Applicant: NXP USA, Inc., Austin, TX (US)

(72) Inventor: Hao Zhang, Toulouse (FR)

(73) Assignee: NXP USA, Inc., Austin, TX (US)

( * ) Notice: Subject to any disclaimer, the term of this patent is extended or adjusted under 35 U.S.C. 154(b) by 29 days.

(21) Appl. No.: 16/701,677

(22) Filed: Dec. 3, 2019

(65) Prior Publication Data

US 2020/0204120 A1 Jun. 25, 2020

(30) Foreign Application Priority Data

Dec. 19, 2018 (EP) .................................... 18306733

(51) Int. Cl.
| | |
|---|---|
| *H03F 1/32* | (2006.01) |
| *H03F 1/02* | (2006.01) |
| *H03F 3/193* | (2006.01) |
| *H03F 3/21* | (2006.01) |
| *H03F 3/217* | (2006.01) |

(52) U.S. Cl.
CPC ......... *H03F 1/3282* (2013.01); *H03F 1/0288* (2013.01); *H03F 1/3247* (2013.01); *H03F 1/3276* (2013.01); *H03F 3/193* (2013.01); *H03F 3/211* (2013.01); *H03F 3/2171* (2013.01)

(58) Field of Classification Search
CPC .... H03F 1/3282; H03F 1/0288; H03F 1/3247; H03F 1/3276; H03F 3/193; H03F 3/211; H03F 3/2171
USPC ....................................................... 330/277
See application file for complete search history.

(56) References Cited

U.S. PATENT DOCUMENTS

| 7,315,207 B2 | 1/2008 | Shiikuma | |
|---|---|---|---|
| 9,461,596 B1 | 10/2016 | Ozard | |
| 2015/0145601 A1* | 5/2015 | Moronval | H03F 1/0288 330/295 |
| 2018/0115284 A1* | 4/2018 | Blednov | H03F 1/0288 |

FOREIGN PATENT DOCUMENTS

EP    2876810 A1    5/2015

OTHER PUBLICATIONS

Giofre, Rocco et al; "A Design Approach to Mitigate the Phase Distortion in GaN MMIC Doherty Power Amplifiers"; Proceedings of the 11th European Microwave Integrated Circuits Conference, London, UK; 4 pages (Oct. 3-4, 2016).

* cited by examiner

*Primary Examiner* — Hafizur Rahman
(74) *Attorney, Agent, or Firm* — Sherry W. Schumm

(57) ABSTRACT

The embodiments described herein include amplifiers that are typically used in radio frequency (RF) applications. Specifically, the amplifiers described herein include a phase distortion compensation circuit that can compensate for input impedance variations that could otherwise lead to reduced efficiency and power performance. In one specific embodiment, the phase distortion compensation circuit is used to compensate for input impedance variations in the peaking amplifiers of a Doherty amplifier. In such embodiments, the phase distortion compensation circuit can absorb the non-linear input impedances of the peaking amplifiers in a way that may facilitate improved phase maintenance between the carrier and peaking stages of the Doherty amplifier.

18 Claims, 11 Drawing Sheets

AMPLIFIER DEVICES WITH PHASE DISTORTION COMPENSATION AND METHODS OF MANUFACTURE THEREOF

CROSS-REFERENCE TO RELATED APPLICATION

This application claims priority under 35 U.S.C. § 119 to European Patent Application No. 18306733.9, filed on Dec. 19, 2018, the contents of which are incorporated by reference herein.

TECHNICAL FIELD

Embodiments of the subject matter described herein relate generally to amplifiers, and more particularly to radio frequency (RF) power amplifiers used in a variety of applications.

BACKGROUND

In general, amplifiers are used to increase the power of signals. For example, amplifiers can be used to convert low-power radio frequency (RF) signals into larger RF signals for driving the antenna of a transmitter. In such cases, amplifiers may be implemented as part of an overall power amplifier used by an RF transmission system.

Power amplifiers tend to consume a significant portion of the total power consumed by a transmission system. Therefore, the power amplifier's efficiency (i.e., the power of the amplifier output signal divided by the total power consumed by the amplifier) is an amplifier quality that designers consistently strive to increase.

Another important amplifier parameter is linearity. In general, amplifier linearity is a measurement of how accurate the output signal is compared to the input signal applied to the input of the amplifier, particularly when generating high power. Unfortunately, many amplifier designs with high theoretical power efficiencies like, for example, widely used Doherty amplifiers, can have relatively poor linearity. For example, some amplifiers can have a significant variation in input impedance versus power and efficiency. Such a variation can lead to significant distortion in the output.

As one specific example, some Doherty amplifier implementations use transistors that have significant non-linear input impedance variations. Such non-linear variations can lead to unmatched phase/amplitude current combinations and significant AM/PM distortion in the Doherty amplifier. This can reduce the overall efficiency and/or power performance of the Doherty amplifier. Therefore, there remains a need for amplifiers that provide both relatively high efficiency and relatively high linearity, particularity for high power RF applications.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The embodiments described herein can provide amplifiers, and particularly radio frequency (RF) amplifiers, with improved performance. Specifically, the amplifiers described herein include a phase distortion compensation circuit that can compensate for input impedance variations that could otherwise lead to reduced efficiency and power performance.

In one specific embodiment the phase distortion compensation circuit is used to compensate for input impedance variations in the peaking amplifiers of a Doherty amplifier with two or more peaking amplifiers. In such embodiments, the phase distortion compensation circuit can absorb the non-linear input impedances of the peaking amplifiers in a way that provides facilitate improved phase maintenance between the carrier and peaking stages of the Doherty amplifier. In some embodiments, this use of the phase distortion compensation circuit can increase efficiency and power performance in the Doherty amplifier. Furthermore, in some embodiments this use of a phase distortion compensation circuit can provide improved wideband performance by reducing AM/PM distortion in the Doherty amplifier.

Figure 1:
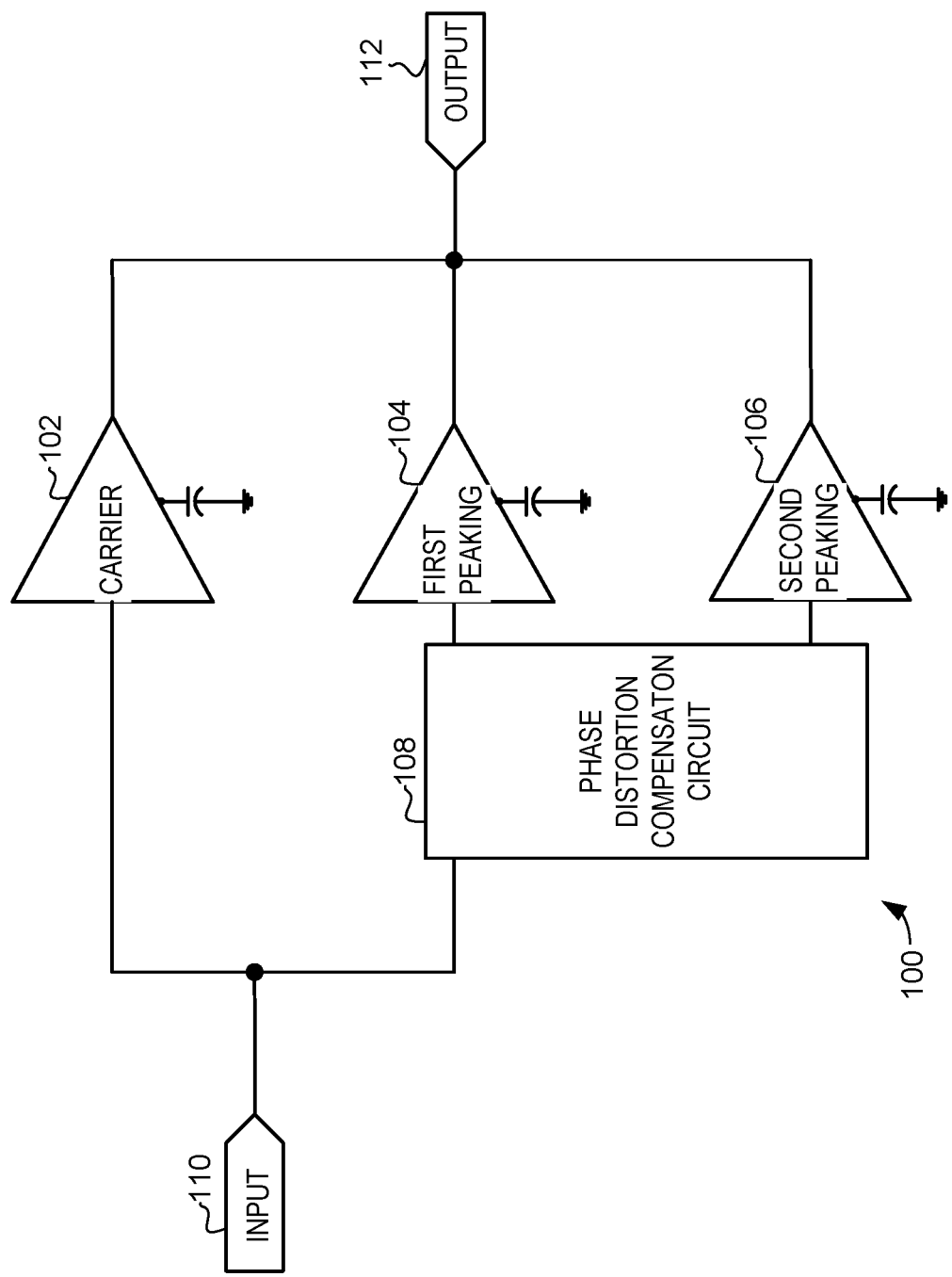
FIG. 1 is a schematic diagram of a Doherty amplifier in accordance with an example embodiment.

Turning now to FIG. 1, a schematic diagram of a portion of an exemplary amplifier 100 is illustrated. The amplifier 100 includes a carrier amplifier 102 (including one or more carrier transistors), a first peaking amplifier 104 (including one or more first peaking transistors), a second peaking amplifier 106 (including one or more second peaking transistors), a phase distortion compensation circuit 108, an RF input node 110, and an output load node 112. It should be noted that amplifier 100 is a simplified representation of a portion of an amplifier, and in a more typical implementation the amplifier 100 would include additional features not illustrated in FIG. 1.

In accordance with the embodiments described herein, the phase distortion compensation circuit 108 is coupled to the inputs of both the first peaking amplifier 104 and the second peaking amplifier 106. In general, this phase distortion compensation circuit 108 is configured to compensate for input impedance variations in the first peaking amplifier 104 and the second peaking amplifier 106.

As described above, in typical embodiments the first peaking amplifier 104 and the second peaking amplifier 106 can include significant input impedances. For example, in a typical embodiment each of the amplifiers 104 and 106 can be implemented with one or more transistors, and those transistors can each have intrinsic input capacitance. For example, in embodiments where those transistors include field effect transistors (FETs) each transistor can have an intrinsic gate capacitance, commonly referenced as $C_{GS}$. Furthermore, in some embodiments these intrinsic input impedances can have significant variations, including non-linear variations. In some embodiments, these non-linear variations in input capacitances can include voltage and frequency dependent non-linear variations. Such non-linear variations in the input impedance can lead to unmatched phase/amplitude current combinations in carrier amplifier 102, the first peaking amplifier 104, and the second peaking amplifier 106. This unmatched phase/amplitude current combination can cause significant distortions in the output of the amplifier 100, including AM/PM distortions. This can reduce the overall efficiency and/or power performance of the amplifier 100.

To compensate for these distortions the phase distortion compensation circuit 108 is configured to at least partially absorb the non-linear variations in the intrinsic input impedances of the peaking amplifiers 104 and 106. For example, the phase distortion compensation circuit 108 can absorb these non-linear variations by providing a phase pre-distortion between the first peaking amplifier 104 and the second peaking amplifier 106. In one example, the phase distortion compensation circuit 108 results in an expansion characteristic that tracks the phase variation of the carrier amplifier 102. Specifically, the carrier amplifier 102 input phase tends to increase with the power level where the peaking amplifier starts to operate. This phase increase is a result of the Miller effect as gain in the carrier amplifier 102 starts to compress as the active load-pull principle in the Doherty amplifier 100 makes the load of the carrier amplifier 102 move toward more powered/less gain region.

Figure 2:
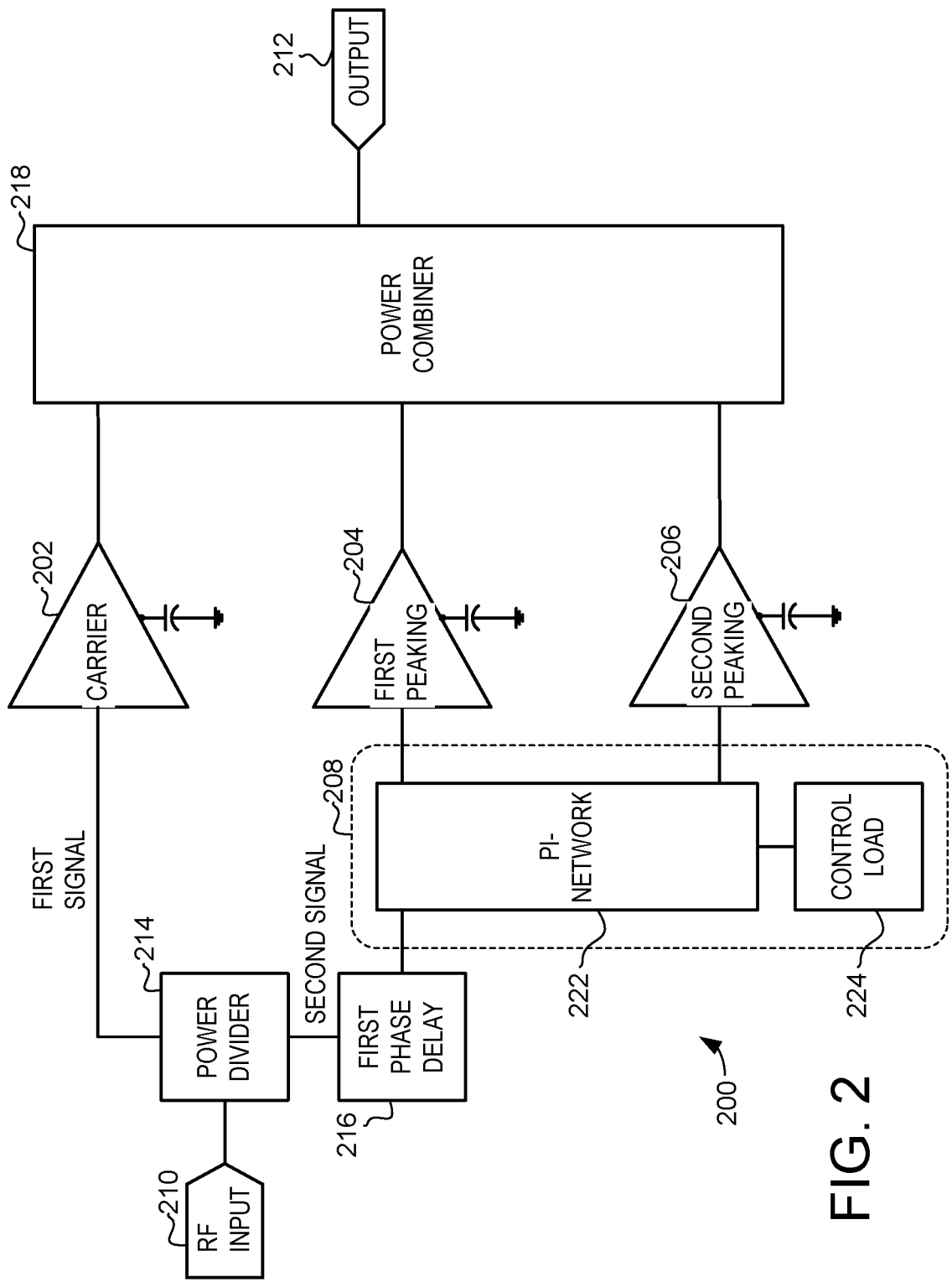
FIG. 2 is a schematic diagram of a Doherty amplifier in accordance with an example embodiment.

In one embodiment, the phase distortion compensation circuit 108 includes a Pi-network (e.g., Pi-network 222, FIG. 2) coupled to a control load circuit (e.g., control load circuit 224, FIG. 2, which may be defined as a circuit network that includes two shunt circuits, and a series circuit coupled between the two shunt circuits). This Pi-network is coupled between an input of the first peaking amplifier 104 and an input of the second peaking amplifier 106, and the control load circuit is coupled to the Pi-network.

The Pi-network can include at least a first shunt inductance (e.g., inductance 352, FIG. 3), a second shunt inductance (e.g., inductance 354, FIG. 3), and a first phase shift inductance (e.g., inductance 356, FIG. 3) arranged in a Pi configuration. In such an embodiment the first shunt inductance can be implemented in parallel with the first intrinsic input capacitance of the first peaking amplifier 104. Likewise, the second shunt inductance can be implemented in parallel with a second intrinsic input capacitance of the second peaking amplifier 106. The first phase shift inductance is then implemented between the first shunt inductance and the second shunt inductance. Likewise, the control load circuit can be coupled to the Pi-network between the first shunt inductance and the second shunt inductance. So configured, the Pi-network and the control load circuit can at least partially absorb the non-linear variations in the intrinsic input impedances of the peaking amplifiers 104 and 106. This absorption of the non-linear variations of the input impedances can improve the phase maintenance between the carrier amplifier 102 and peaking amplifiers 104 and 106, and can improve performance of the amplifier 100.

In some such embodiments the intrinsic input impedances are capacitances, and these capacitances are effectively made part of the Pi-network. Furthermore, in some embodiments the Pi-network can additionally include a first blocking capacitor coupled to the first shunt inductance and a second blocking capacitor coupled to the second shunt inductance.

As will be described in greater detail below, in some embodiments the Pi-network is configured to provide a phase-constant impedance match network over a specified bandwidth. In other embodiments, the Pi-network is configured to provide a phase-expansion impedance match network over a specified bandwidth.

In general, the control load circuit controls the phase pre-distortion provided by the Pi-network by presenting a frequency dependent load to the Pi-network. The control load circuit can be implemented to include a variety of types of circuits. For example, the control load circuit can comprise a resistor coupled to a ground reference node (e.g., circuit 402, FIG. 4A). As another example, the control load circuit can comprise an L-network coupled to a ground reference node (e.g., circuit 404, FIG. 4B). As another example, the control load circuit can comprise a T-network coupled to a ground reference node (e.g., circuit 406, FIG. 4C). As another example, the control load circuit can comprise a high pass T-network coupled to a ground reference node (e.g., circuit 408, FIG. 4D). As another example, the control load circuit can comprise a second Pi-network coupled to a ground reference node (e.g., circuit 410, FIG. 4E).

Turning now to FIG. 2, a circuit diagram representing a portion of a Doherty amplifier 200 is illustrated. In this illustrated embodiment, the Doherty amplifier 200 receives an RF input signal at the input node 210 and drives an amplified signal to an output node 212, where that output node 212 is coupled to a suitable load (e.g., an antenna). The amplifier 200 includes a carrier amplifier 202, a first peaking amplifier 204, a second peaking amplifier 206, a phase distortion compensation circuit 208, a power divider 214, a first phase delay 216, and a power combiner 218.

In general, the divider 214 receives an RF signal and generates two output signals. These two outputs correspond to the first signal and second signal that are applied to the carrier amplifier 202 and peaking amplifiers 204, 206 respectively. The two outputs can be in the form of equal-power or unequal-power signals. The first phase delay 216 provides 90 degree delay in the second signal before outputting the second signal to the phase distortion compensation circuit 208. The phase distortion compensation circuit 208 further divides the second signal into third and fourth signals, which are applied to the first and second peaking amplifiers 204, 206, respectively. As will be described in greater detail below, a second 90 degree phase delay is applied by the phase distortion compensation circuit 208 before outputting the fourth signal to the second peaking amplifier 206. These consecutive 90 degree differences in phase allows the outputs of the peaking amplifiers 204, 206 to be in step with the carrier amplifier 202 output when combined by the combiner 218.

The amplifier 200 receives and amplifies the first signal and the phase delayed third and fourth signals, combines the amplified first, third, and fourth signals in phase, and drives the combined signal to the output node 212. The carrier amplifier 202 includes one or more carrier transistors, and the peaking amplifiers 204, 206 each include one or more peaking transistors. The outputs of the carrier and peaking transistors are coupled to combiner 218. Conceptually, the combiner 218 can be considered to include multiple ¼ wave transformers and inductances that serve to combine the outputs of the carrier amplifier 202 and peaking amplifiers 204, 206 such that the combined output can be delivered to the load. For example, the combiner 218 can include first ¼ wave transformers and second ¼ wave transformers. In general, the first ¼ wave transformers works to combine the current from the carrier amplifier 202 and the first peaking amplifier 204, while the second ¼ wave transformers works to combine the current of the carrier amplifier 202, the first peaking amplifier 204, and the second peaking amplifier 206. Thus, the combiner 218 can use ¼ wave transformers to facilitate the in-phase combining of the carrier amplifier 202 output with the outputs of the peaking amplifiers 204, 206. The combiner 218 can also provide an impedance inverter between the outputs of the carrier amplifier 202 and the peaking amplifiers 204, 206. During operation, the impedance inverter effectively changes the impedance seen by the carrier amplifier 202 to provide an optimal load to the carrier amplifier 202 at and around the operational frequency (or center frequency of operation, $f_O$, of the amplifier 200).

In a typical Doherty implementation, the carrier amplifier 202 is configured to operate as a class AB amplifier, and is used to drive the main body of the output signal. Conversely, the peaking amplifiers 204, 206 are typically configured to operate as class C amplifiers, and are used to the drive the peaks of the output signal. This use of these three amplifiers 202, 204, 206 as class AB and class C amplifiers with outputs that are combined together can provide both relatively high power output and high efficiency.

Specifically, in a typical Doherty implementation when the input RF signal is at relatively low signal levels, the carrier amplifier 202 operates near its compression point and thus with high efficiency, while the peaking amplifiers 204, 206 are not operating. Thus, at relatively low signal levels the Doherty amplifier 200 can provide both high efficiency and good linearity. Then, when higher signal levels occur, the carrier amplifier 202 compresses, the first peaking amplifier 204 starts to operate, and at even higher signal levels, the second peaking amplifier 206 starts to operate, thus "topping up" the resulting output signal. Thus, the peaking amplifiers 204, 206 provide the ability to achieve high power output during times of high input signal levels. Thus, the two drivers of the Doherty amplifier together can provide relatively high power output and high efficiency. Stated another way, a Doherty amplifier thus can combine class AB and class C amplifiers in a way that maintains linearity while providing high power efficiency, and can further provide a high power output.

In a typical embodiment, the carrier amplifier 202 and peaking amplifiers 204, 206 would be implemented with suitable RF-capable transistors with relatively high power capability. For example, the carrier amplifier 202 and peaking amplifiers 204, 206 can be implemented with Gallium Nitride (GaN) transistors or silicon-based laterally diffused metal oxide semiconductor (LDMOS) transistors. In any event, the "input" of a transistor is a control terminal (e.g., a gate terminal, "G") of the transistor, and the "output" of a transistor is a current carrying terminal (e.g., a drain terminal, "D", or source terminal, "S") of the transistor. In various embodiments, the other current carrying terminal (e.g., the source or drain terminal) is coupled to a ground node of the device (e.g., to the device package substrate or flange).

As described above, these transistors in the first peaking amplifier 204 and the second peaking amplifier 206 can include significant input impedances. For example, the transistors in the first peaking amplifier 204 and the second peaking amplifier 206 can each have a significant intrinsic gate capacitance, commonly referenced as $C_{GS}$. Furthermore, these intrinsic input impedances can have significant non-linear variations, including voltage and frequency dependent non-linear variations.

In accordance with the embodiments described herein, the amplifier 200 includes phase distortion compensation circuit 208 to at least partially compensate for the negative effects of these non-linear variations in input impedance. Specifically, the phase distortion compensation circuit 208 is configured to at least partially absorb the non-linear variations in the intrinsic input impedances of the peaking amplifiers 204 and 206. For example, the phase distortion compensation circuit 208 can absorb these non-linear variations by providing a phase pre-distortion between the first peaking amplifier 204 and the second peaking amplifier 206. In some such embodiments the intrinsic input impedances are capacitances, and these capacitances are effectively made part of the Pi-network 222.

In this illustrated embodiment, the phase distortion compensation circuit 208 includes a Pi-network 222 coupled to a control load circuit 224. Specifically, the Pi-network 222 is coupled between an input of the first peaking amplifier 204 and an input of the second peaking amplifier 206, and the control load circuit 224 is coupled to the Pi-network 222.

Figure 3A:
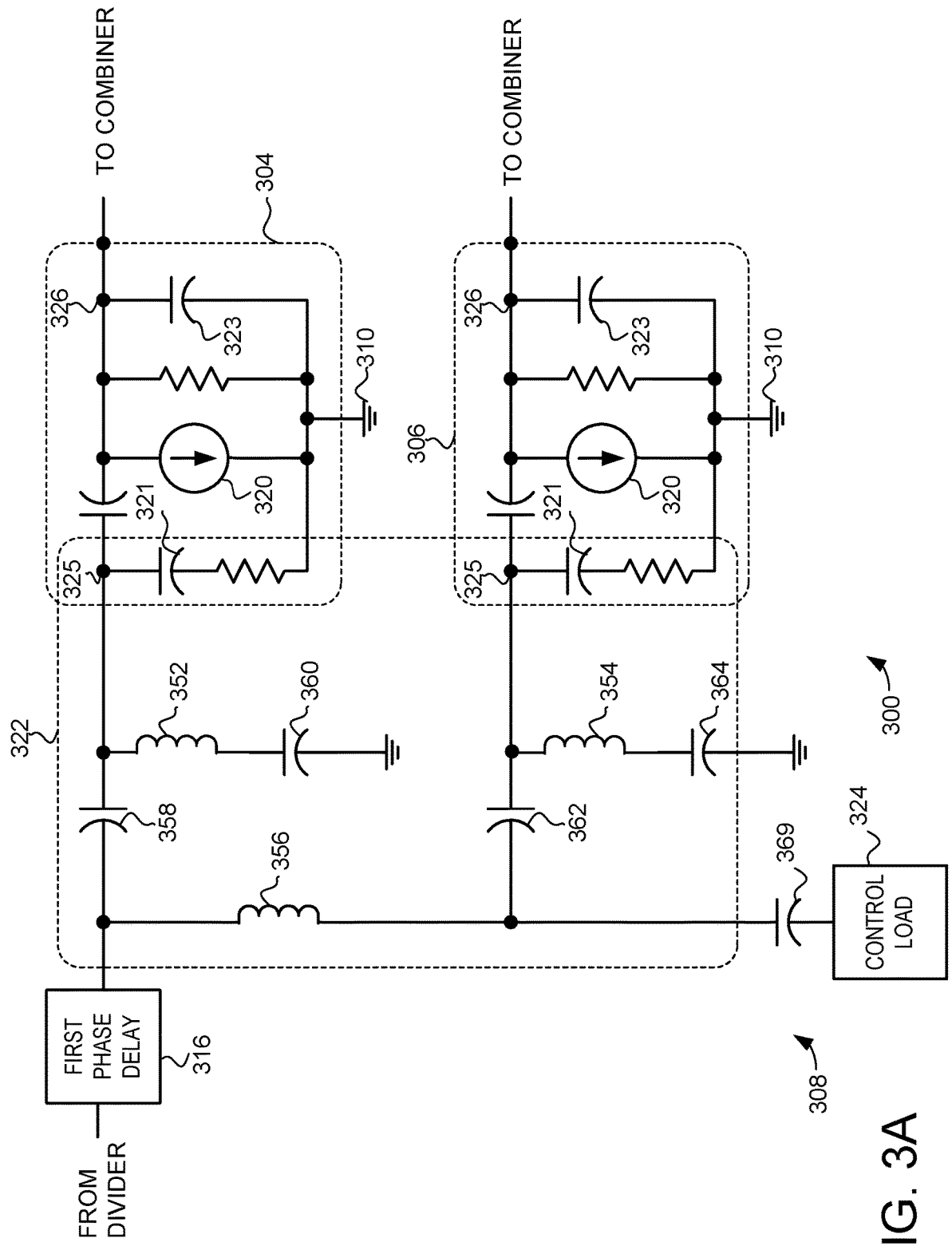
FIGS. 3A and 3B are circuit diagrams of portions of exemplary Doherty amplifiers in accordance with example embodiments.

Turning now to FIG. 3A, a more detailed example of a portion of a Doherty amplifier 300 is illustrated schematically. Specifically, FIG. 3A shows the portion of a Doherty amplifier 300 that includes a first peaking amplifier 304, a second peaking amplifier 306, a first phase delay 316, and a phase distortion compensation circuit 308. In this illustrated embodiment, the phase distortion compensation circuit 308 again includes a Pi-network 322 coupled to a control load circuit 324.

In FIG. 3A, the first peaking amplifier 304 and the second peaking amplifier 306 are illustrated as transistors, with each of the transistors modelled as a current source 320 and associated resistances and capacitances. Included in this transistor model for each transistor includes an intrinsic input capacitance 321 and an intrinsic output capacitance 323. In a typical field-effect transistor implementation, the intrinsic input capacitance 321 would represent a gate-source capacitance commonly referred to as $C_{GS}$. In a typical bipolar transistor, the intrinsic input capacitance 321 would be a base-emitter capacitance commonly referred to as $C_{BE}$. Furthermore, each transistor includes a transistor input terminal 325 (e.g., a control terminal, gate or base) and a transistor output terminal 326 (e.g., a current conducting terminal, drain, source, collector or emitter).

The Pi-network 322 is coupled between an input (e.g. transistor input terminal 325) of the first peaking amplifier 304 and an input (e.g. transistor input terminal 325) of the second peaking amplifier 306. In this illustrated embodiment the Pi-network 322 includes a first shunt inductance 352, a second shunt inductance 354, and a first phase shift inductance 356 arranged in a Pi-type configuration. In this illustrated embodiment the Pi-network 322 is configured to absorb and thus includes both of the intrinsic input capacitances 321. Finally, in this embodiment the Pi-network 322 also includes a first capacitance 358, second capacitance 360, third capacitance 362 and fourth capacitance 364, implemented for DC current blocking.

In general, the Pi-network 322 functions as a flexible power splitter and phase delayer for the first peaking amplifier 304 and the second peaking amplifier 306. Specifically, the Pi-network 322 provides shunt inductance paths (including inductors 352, 354) that absorb the intrinsic input capacitances 321 and provide a series inductance path (including inductor 356) that provides a phase delay. The Pi-network 322 is loaded by the control load circuit 324, where the control load circuit provides a selected impedance profile to achieve wideband performance. The Pi-network 322 specifically uses the non-linear characteristics of the intrinsic input capacitances 321. Specifically, the absorption of the intrinsic input capacitances 321 into the Pi-network 322 loaded with the control load circuit 324 provides a floated phase difference at the peaking amplifier 304, 306 inputs.

In this illustrated embodiment the first shunt inductance 352 is implemented in parallel with the intrinsic input capacitance 321 of the first peaking amplifier 304. Likewise, the second shunt inductance 354 is implemented in parallel with the intrinsic input capacitance 321 of the second peaking amplifier 306. The first phase shift inductance 356 is then implemented between the first shunt inductance 352 and the second shunt inductance 354, and is implemented to provide the desired phase shift between the first peaking amplifier 304 and the second peaking amplifier 306. For example, the first phase shift inductance 356 can be configured to provide a phase shift of about 90 degrees (plus or minus 5 degrees). So configured, the various capacitances and inductances implement a Pi-network 322 between the inputs of the first peaking amplifier 304 and the second peaking amplifier 306.

In general, the first capacitance 358 and the third capacitance 362 provide series DC blocking capacitances, while the second capacitance 360 and the fourth capacitance 364 provide an RF ground for their respective inductances 352 and 354. In one embodiment the DC blocking capacitances are selected to provide wideband operation. For example, a ratio of capacitance values for the series DC blocking capacitances 358, 362 to the intrinsic input capacitance 321 from 1:1 to 1:2 can provide good wideband operation.

In general, the Pi-network 322 provides two shunt inductance paths, two shunt capacitance paths, and a series inductance path. The first shunt inductance path is provided by the first shunt inductance 352 and the second capacitance 360. The second shunt inductance path is provided by the second shunt inductance 354 and the fourth capacitance 364. The first shunt capacitance path is provided by the first capacitance 358, the first shunt inductance 352, the second capacitance 360, and the intrinsic input capacitance 321 of the first peaking amplifier 304. The second shunt capacitance path is provided by the third capacitance 362, the second shunt inductance 354, the fourth capacitance 364, and the intrinsic input capacitance 321 of the second peaking amplifier 306. Finally, the series inductance path is provided by the series inductance 356.

In general, the each of the shunt inductance paths effectively compensates for its corresponding intrinsic input capacitances 321, and the Pi-network 322 effectively absorbs these compensated intrinsic capacitances 321. The shunt capacitance path is thus effectively compensated by its corresponding shunt inductance path. Stated another way, the compensation of the intrinsic input capacitances 321 by the shunt inductance paths reduces the associated shunt capacitive paths, resulting in a more linear amplifier response. In some embodiments, the capacitance of the shunt capacitive paths can be reduced by a factor of eight and be made relatively small compared to the intrinsic input capacitances 321. With the shunt capacitive path's effective capacitance reduced to be smaller than the intrinsic input capacitances 321 a more matched impedance and matched gain is provided for wideband applications.

The first shunt inductance 352 and the second shunt inductance 354 are configured to interact with their respective parallel intrinsic input capacitances 321 in a way that at least partially absorbs the non-linear variations in the intrinsic input capacitances 321. Specifically, the first shunt inductance 352 and the second shunt inductance 354 bias their respective amplifier inputs, while less affecting their respective shunt capacitive paths provided by the intrinsic input capacitances because the DC blocking capacitors 358, 362 are effectively in series with the intrinsic input capacitances. Thus, the intrinsic input capacitances are absorbed into the shunt inductance paths provided by the Pi-network 322, while the relatively high Q of the DC blocking capacitors 358, 362 in these shunt capacitance paths add very little phase change since they both have the same capacitive property.

In the Pi-network 322 the effective capacitance of each shunt capacitance path changes as the power sweep level changes. Thus, each shunt capacitance path is providing a non-linear path that creates a controlled amount of corrective pre-distortion that increases as input power increases. With the corrective phase pre-distortion created at the input of the Pi-network, the input phase variation of the first peaking amplifier 304 is minimized, compared with peaking amplifiers employing a conventional matching topology.

Generally, the inductance of the first shunt inductance 352 is selected to create a resonance frequency with the intrinsic input capacitance 321 of the first peaking amplifier 304 at a frequency below the targeted operational frequency band for the amplifier 308. Likewise, the inductance of the second shunt inductance 354 is selected to create a resonance frequency with the intrinsic input capacitance 321 of the second peaking amplifier 306 at a frequency below the targeted operational frequency band.

In one embodiment, a specified input power level can be used to select the various impedances of the Pi-network. Specifically, a specified input power level, $P_{in,peakings}$, at the input of the Pi-network can be chosen, which further drives peaking amplifiers 304, 306. Typically, this input power level is chosen to correspond to the level at output power saturation of the Doherty amplifier. Depending on each peaking amplifier's 304, 306 technology parameter, a certain level of magnitude of the driving signal $V_{gs}$, can be determined. Also, the DC blocking capacitor 358 acts as a voltage divider with a ratio as 1:K, expressed as the magnitude of $V_{gs}$, divided by the magnitude of the voltage at the input node of the Pi-network. The desired characteristic impedance $Z_{pi}$ of the Pi-network 322 can then be derived from:

$$P_{in,peakings} = \frac{K^2 * |V_{gs}^2|}{2 * Z_{pi}} \qquad \text{Equation 1}$$

where the series inductance L of the Pi-network 322 can be calculated as:

$$L = \frac{Z_{pi}}{2\pi f_0} \qquad \text{Equation 2}$$

where $f_0$ indicates the center frequency of the targeted frequency band. So configured, the capacitance value C of each shunt capacitance path should be approximately:

$$C = \frac{1}{(2\pi f_0)^2 * L} \qquad \text{Equation 3}$$

where $f_0$ again indicates the center frequency of the targeted frequency band.

As stated above, the control load circuit 324 is coupled to the Pi-network 322 between the first shunt inductance 352 and the second shunt inductance 354. In this particular implementation, the control load circuit 324 is coupled to the Pi-network 322 through a DC blocking capacitor 369, although such a DC blocking capacitor 369 is not required in many embodiments. As described above, the control load circuit 324 can be implemented to include a variety of types of circuits, examples of which will be described in greater detail below.

In some embodiments, the Pi-network 322 and the control load circuit 324 are together configured to provide a phase-constant impedance match network over a specified bandwidth. This phase-constant behavior can be provided by using the variation in the intrinsic input impedance 321 for the second peaking amplifier 306 to correct for the variation in the intrinsic input impedance for the first peaking amplifier 304. In such embodiments the control load circuit can be implemented to present a resistance value approximately equal to $Z_{pi}$.

In other embodiments, the Pi-network 322 is configured to provide a phase-expansion impedance match network over a specified bandwidth. In such embodiments the control load should present a resistance value greater than $Z_{pi}$. The created phase expansion characteristic could track the phase variation of the carrier amplifier, which is a phase expansion caused by the Miller effect of gain compression.

Figure 3B:
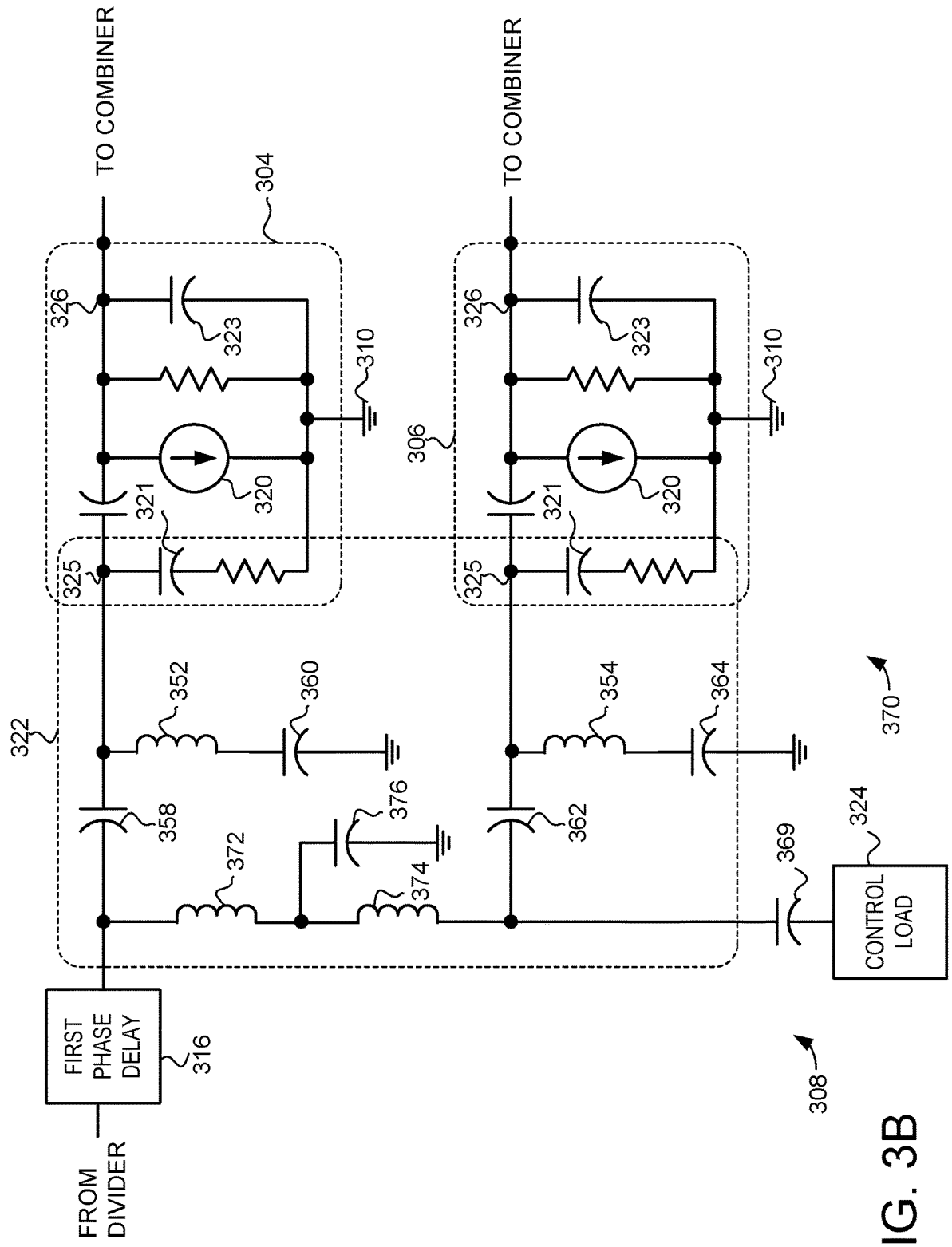

Turning now to FIG. 3B, a second more detailed example of a portion of a Doherty amplifier 370 is illustrated schematically. In this embodiment the first phase shift inductance 356 has been replaced with a T-network that includes a first phase shift inductance 372, a second phase shift inductance 374, and a capacitance 376. In this embodiment each of the first phase shift inductance 372 and the second phase shift inductance 374 can be implemented to provide a portion of the needed phase shift. For example, each of the first phase shift inductance 372 and the second phase shift inductance 374 can be implemented to provide a phase shift of about 45 degrees, with a total phase shift of about 90 degrees being provided by the Pi-network 322.

Such an embodiment can provide the same bandwidth while also providing less sensibility as the embodiment of FIG. 3A. In other embodiments this arrangement can be used to increase the bandwidth of the amplifier 370 as the impedance transformation trajectory is shorted in each element.

As described above, a control load circuit 324 is coupled to the Pi-network 322 between the first shunt inductance 352 and the second shunt inductance 354. The control load circuit 324 can be implemented to include a variety of types of circuits. In general, the control load circuit 324 controls the phase pre-distortion provided by the Pi-network by presenting a frequency dependent load to the Pi-network. To facilitate wideband operation the control load circuit 324 reduces the effective shunt path capacitance in the Pi-network 322. For example, by connection of a shunt inductance and series capacitance, with the series capacitance acting as a voltage divider, the control load circuit 324 reduces the effective shunt path capacitance.

As some examples, the control load circuit 324 can comprise a pure resistor termination or be extended with a ladder topology (e.g., L, T, or Pi shape). Typically, the control load circuit 324 would be selected based on a required input signal amplitude and a specified functional bandwidth. In some embodiments the control load circuit 324 provides an additional inductive property to absorb parts of the effective capacitance of the shunt paths provided by the Pi-network 322. In such embodiments the control load circuit 324 could be implemented to adapt as frequency increases.

Figure 4B:
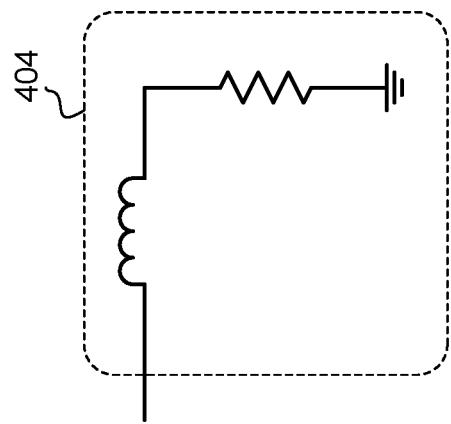
FIGS. 4A, 4B, 4C, 4D, and 4E are circuit diagrams of exemplary control load circuits in accordance with example embodiments.
Figure 4C:
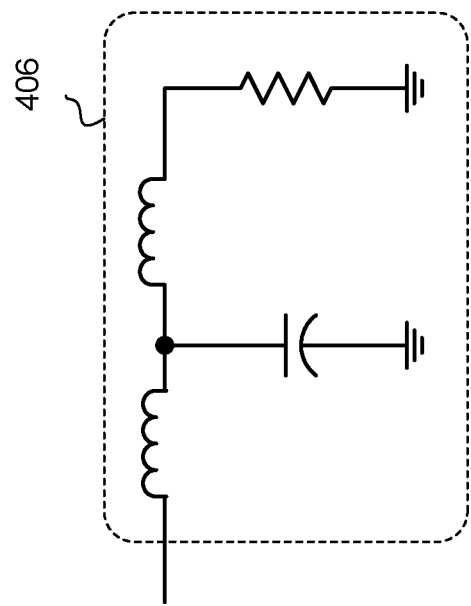
Figure 4A:
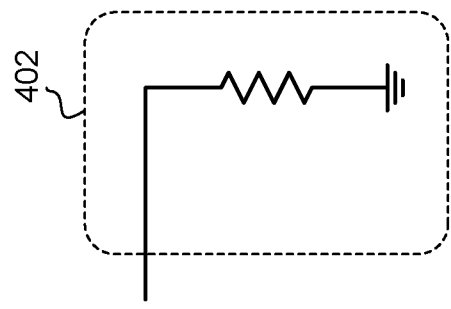

Turning now to FIGS. 4A-4E, several detailed examples of such control load circuits are given. Specifically, FIG. 4A illustrates an exemplary control load circuit 402 that comprises a resistor coupled to a ground reference node. Such an embodiment can be used, for example, in applications that do not require a relatively large operational bandwidth.

FIG. 4B illustrates an exemplary control load circuit 404 that comprises an L-network coupled to a ground reference node. More specifically, control load circuit 404 includes an L-network with an inductor and a resistor coupled in series to a ground reference node. Such an embodiment can absorb part of the effective capacitance of the second shunt capacitance path leading to the second peaking amplifier 306, and can increase the transformed impedance of the whole terminated Pi-network. In some applications this can provide a further increase in the amplifier bandwidth.

FIG. 4C illustrates an exemplary control load circuit 406 that comprises a T-network coupled to a ground reference node. More specifically, control load circuit 406 includes a T-network with two inductors coupled in series to a ground reference node (with a resistor also coupled in series), and a shunt capacitor coupled between the ground reference node and a connection node between the two inductors. Such an embodiment can also absorb part of the effective capacitance of the second shunt capacitance path leading to the second peaking amplifier 306, and can provide an even further increase in amplifier bandwidth.

Figure 4E:
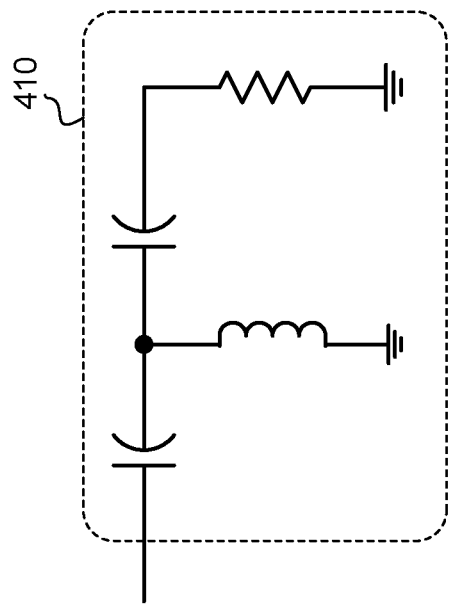
Figure 4D:
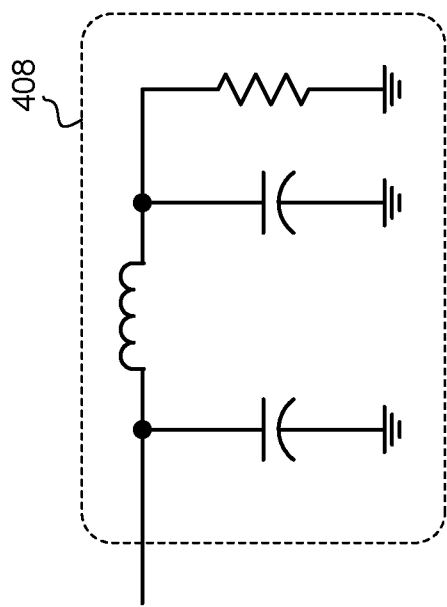

FIG. 4D illustrates an exemplary control load circuit 408 that comprises a high pass T-network coupled to a ground reference node. More specifically, control load circuit 408 includes a T-network with two capacitors coupled in parallel to a ground reference node, and an inductor coupled between the two capacitors (where the inductor and a resistor are coupled in series and to the ground reference node). Finally, FIG. 4E illustrates an exemplary control load circuit 410 that comprises a second Pi-network coupled to a ground reference node. More specifically, control load circuit 410 includes a Pi-network with two capacitors coupled in series to a ground reference node (with a resistor also coupled in series), and a shunt inductor coupled between the ground reference node and a connection node between the two capacitors.

In some embodiments it can be desirable to implement the phase distortion compensation circuit (e.g., phase distortion compensation circuits 108, 208, 308) inside the package with the transistors that make up the carrier amplifier, first peaking amplifier, and second peaking amplifier. As used herein, the term "package" means a collection of structural components (e.g., including a flange or substrate) to which the primary electrical components (e.g., input and output leads, amplifiers 102, 104, 106, and various electrical interconnections) are coupled, where a "package" is a distinct device that may be coupled to a printed circuit board (PCB) or other substrate that includes other portions of the amplifier.

Figure 5:
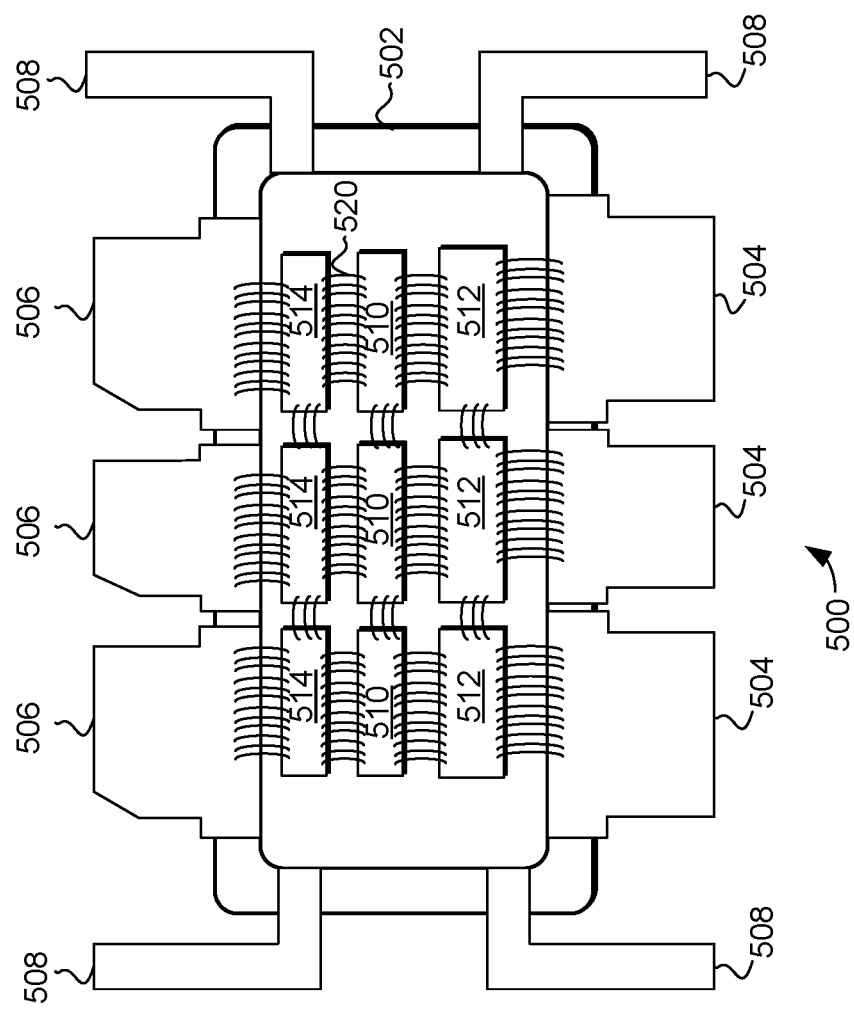
FIG. 5 is a schematic diagram of an exemplary packaged device that includes a portion of an amplifier in accordance with an example embodiment.

Turning now to FIG. 5, a top view of a portion of an exemplary amplifier 500 that is implemented within a single package is illustrated. The amplifier 500 includes a package 502, input leads 504, output leads 506, biasing leads 508, and bond wire arrays 520. The package 502 includes a package substrate 503 (e.g., a flange) to which semiconductor devices (e.g., dies) are mounted. The package substrate 503 may provide an electrical ground reference for the semiconductor devices. The package 502 also may include an isolator that electrically isolates the package substrate 503 from the leads 504, 506 and 508, or alternatively may include encapsulation that provides such electrical isolation. As non-limiting examples, the package 502 may be an air-cavity package or an overmolded (encapsulated) package.

In this illustrated embodiment, a plurality of semiconductor devices is mounted to the package substrate 503, where these semiconductor devices include transistor dies 510, input integrated passive device (IPD) dies 512, and output IPD dies 514.

In one embodiment, the transistor dies 510 can include a carrier transistor, a first peaking transistor, and a second peaking transistor. Likewise, the input IPD dies 512 can include various integrated passive devices that make up the phase distortion compensation circuit (e.g., phase distortion compensation circuits 108, 208, 308). For example, capacitances in the Pi-network and control load circuit (e.g. capacitances 358, 360, 362 and 364) may be implemented as metal-insulator-metal (MIM) capacitors formed on the input IPD dies 512. As another example, inductances in the Pi-network and control load circuit (e.g., first shunt inductance 352, second shunt inductance 354, and first phase shift inductance 356) may be implemented as spiral inductors formed on the input IPD dies 512. Furthermore, some inductances may be implemented with bond wire arrays 520. In other embodiments these capacitances and inductances can be implemented with discrete capacitors and discrete inductors, both inside and outside the package 502.

Furthermore, in some embodiments the input IPD dies 512 and bond wire arrays 520 can implement other components the amplifier 500, including portions of input matching networks, dividers, and phase delays. Likewise, the output IPD dies 514 and bond wire arrays 520 can implement other components, including portions of output matching networks and combiners. It should finally be noted that the amplifier 500 illustrated in FIG. 5 is a simplified representation of such an amplifier, and thus in many typical implementations amplifiers would include additional features not illustrated in FIG. 5.

In this implementation the input leads 504 each are configured to receive an RF signal (e.g., from a signal divider and possibly a phase distortion compensation circuit 108 that is implemented on a PCB to which the package 502 is coupled), and bond wire arrays 520 couple the input leads 504 to input IPD dies 512. When the phase distortion compensation circuit 108 is implemented inside package 502, two of the input leads 504 coupled to the peaking amplifier paths could be combined into one input lead. Likewise, various bond wire arrays 520 couple the transistor dies 510 to the input IPD dies 512 and the output IPD dies 512. Finally, various bond wire arrays 520 connect the output IPD dies 514 to the output leads 506.

It should be noted that the number and arrangement of bond wires would be selected based on the power handling requirements and the desired inductances of the bond wires. Thus, for connections that require more power handling ability more bond wires can be provided. Further, although three separate transistor dies 510 are illustrated, an alternate embodiment may have the transistors implemented on a single die.

As described above, the various embodiments provide a phase distortion compensation circuit that can increase efficiency and power performance in Doherty amplifiers. Furthermore, in some embodiments this use of a phase distortion compensation circuit can provide improved wideband performance by reducing AM/PM distortion in the Doherty amplifier.

Figures 6A, 6B:
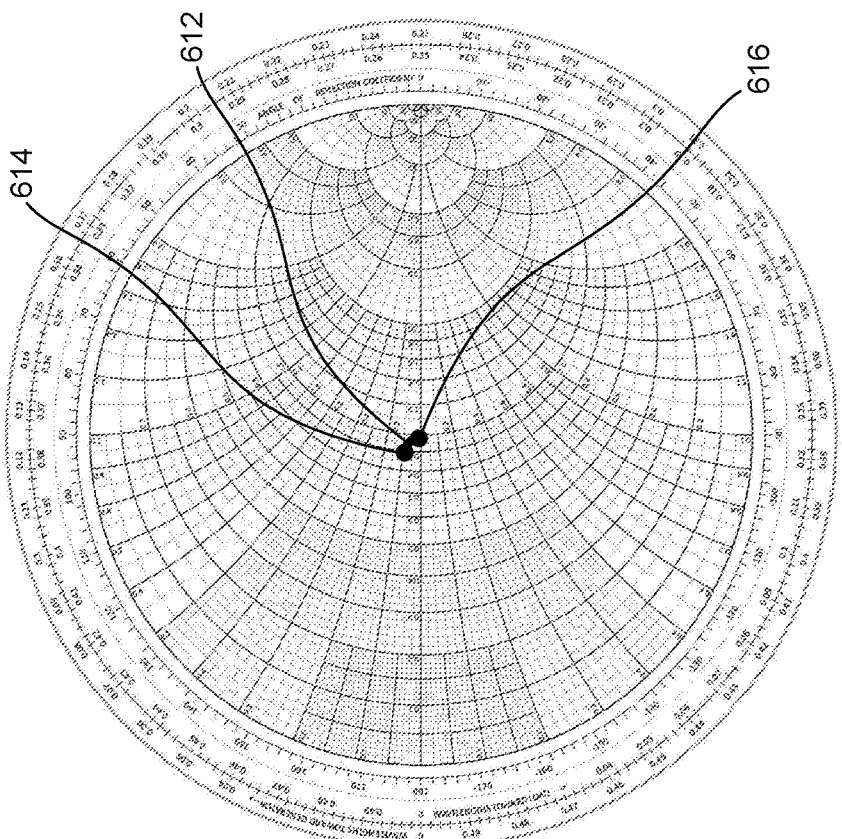
FIGS. 6A and 6B are Smith Charts representing exemplary input impedances.

Specifically, the phase distortion compensation circuit can increase performance in the Doherty amplifier by reducing the impedance and phase spread between the inputs of the first peaking amplifier and the second peaking amplifier. Turning now to FIG. 6A, a Smith Chart 600 shows exemplary variation in input impedance of an amplifier due to changes in power levels. Specifically, line 602 illustrates the change in input impedance as power increases, with point 604 corresponding to the input impedance at 5 decibel-milliwatts (dBm) input power level, while point 606 corresponds to the input impedance at 25 dBm input power level. As shown in Smith Chart 600, the amplifier input impedance undergoes significant variation as power increases. In a Doherty amplifier with two peaking amplifiers this variation will often differ between peaking amplifiers, as each peaking amplifier is changing according to a different power sweep level. This difference in variation can lead to unmatched phase/amplitude current combinations at the output of the Doherty amplifier, and thus may result in significant AM/PM distortion and a reduction in overall efficiency and/or power performance.

Turning now to FIG. 6B, a Smith Chart 610 shows exemplary variation in input impedance of an amplifier due to changes in power levels, but with that variation reduced by the presence of an input phase distortion compensation circuit. Again, line 612 illustrates the change in input impedance as power increases, with point 614 corresponding to the input impedance at 5 dBm input power level, while point 616 corresponds to the input impedance at 25 dBm input power level. As shown in Smith Chart 610, the amplifier input impedance undergoes a large reduction in variation due to the presence of the input phase distortion compensation circuit (e.g., circuit 108, 208). When implemented in a three-way Doherty amplifier with two peaking amplifiers this reduction in variation will reduce the unmatched phase/amplitude current combinations at the output of the Doherty amplifier, and thus will reduce AM/PM distortion and improve overall efficiency and/or power performance.

In a two-way Doherty power amplifier, the phase error between carrier current and peaking current at the combining node should generally be less than 10 degrees to assure good load modulation. This phase error requirement is typically much stricter in three-way Doherty power amplifiers. In three-way Doherty power amplifiers even 10 degrees of phase error can cause severe load modulation distortions. And as described above, such phase error can be caused by non-linearity in the intrinsic input capacitances of the carrier and peaking amplifiers.

Thus, three-way Doherty amplifiers are particularly susceptible to load modulation distortions. These load modulation distortions can degrade overall Doherty amplifier performance, including power, efficiency and linearity. Furthermore, these load modulation distortions can drive the carrier and peaking amplifiers into undesirable operational ranges, such as over-rated drain current or drain voltage during the charging cycle. Thus, in some cases the load modulation distortions can lead to unacceptable device operation.

Figure 7B:
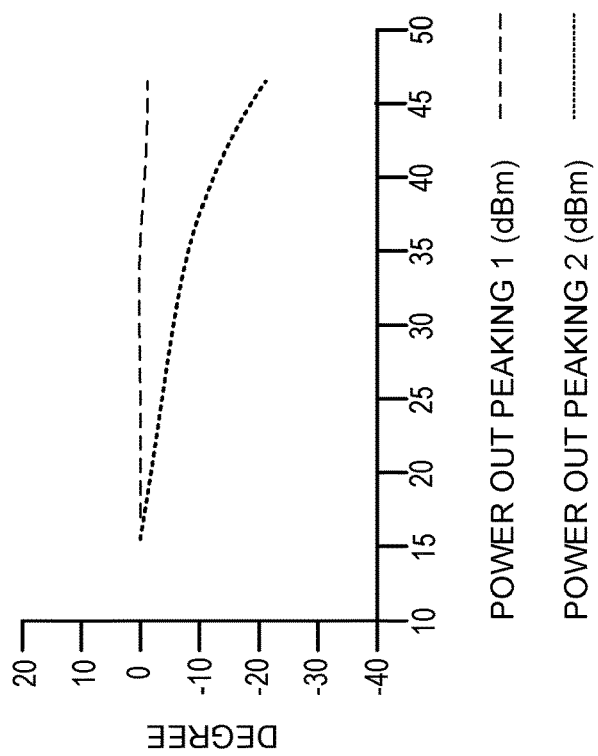
FIGS. 7A, 7B, 7C and 7D are graphs illustrating Doherty amplifier operation in accordance with example embodiments.
Figure 7A:
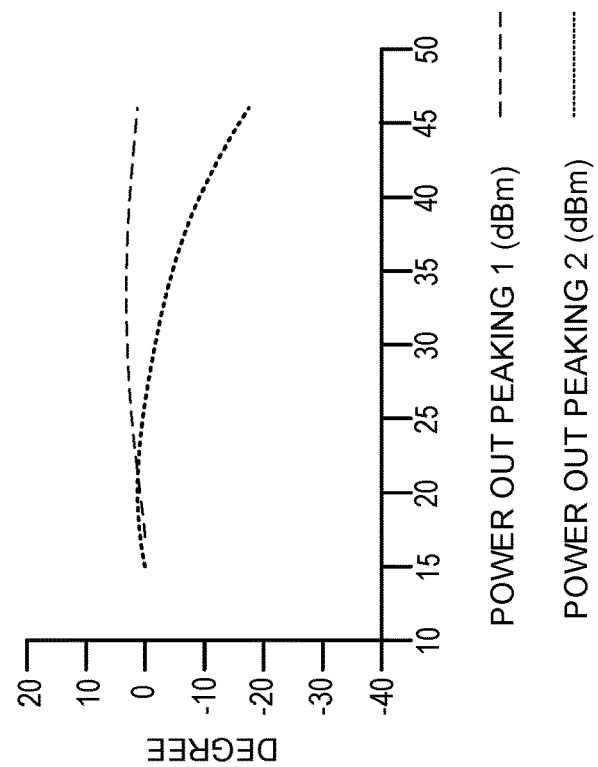

Turning now to FIGS. 7A and 7B, graphs 702 and 704 illustrate performance of an exemplary Doherty amplifier with a phase distortion compensation circuit (e.g. phase distortion compensation circuits 108, 208, 308) configured to provide AM/PM constant behavior. Specifically, graph 702 shows the AM/PM response for both the first peaking amplifier (e.g., first peaking amplifier 104, 204, 304) and the second peaking amplifier (e.g., second peaking amplifier 106, 206, 306). Likewise, graph 704 shows the command voltage phase variation for both the first peaking amplifier and the second peaking amplifier. In these graphs the first peaking amplifier has a constant phase (i.e., AM/PM) response, while the second peaking amplifier as a phase-lagged AM/PM response.

Thus, such a configuration can be implemented to reduce the phase error in the current combination of the first peaking amplifier and carrier amplifier at the combining node. Furthermore, such a configuration can provide reduced variation for the second peaking amplifier output current in its operating power range. The phase-constant behavior can also be implemented to assure less impedance variation at the input, and can thus provide improved gain in the peaking amplifiers, increased Doherty amplifier efficiency, and enhanced linearity, expressed in less distorted AM/AM and AM/PM characteristics.

Figure 7D:
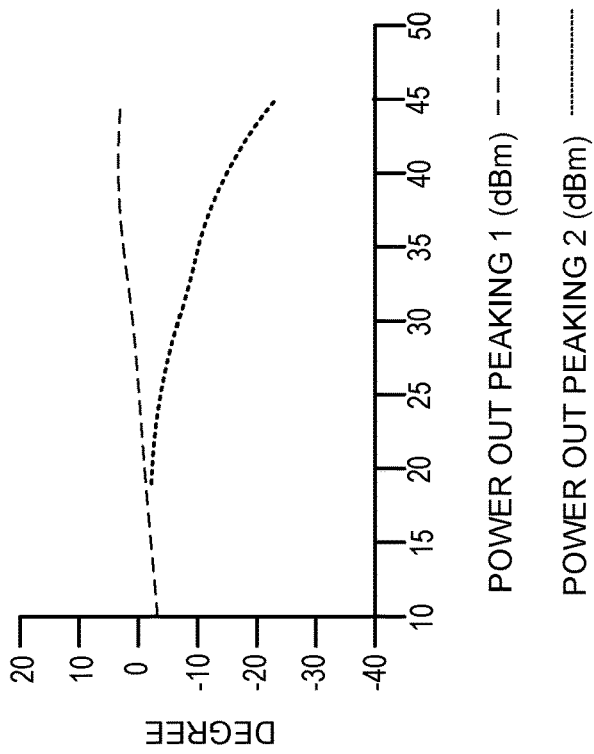
Figure 7C:
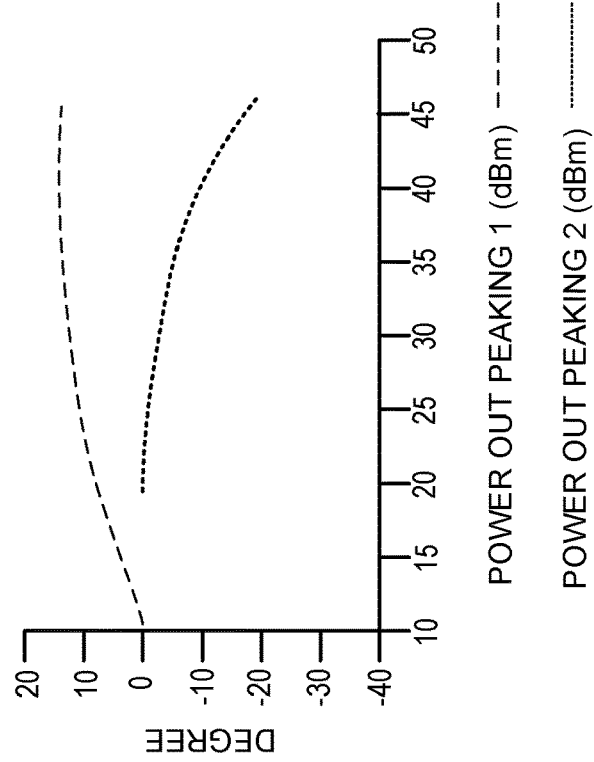

Turning now to FIGS. 7C and 7D, graphs 706 and 708 illustrate performance of an exemplary Doherty amplifier with a phase distortion compensation circuit (e.g. phase distortion compensation circuits 108, 208, 308) configured to provide AM/PM expansion behavior. Specifically, graph 706 shows the AM/PM response for both the first peaking amplifier (e.g., first peaking amplifier 104, 204, 304) and the second peaking amplifier (e.g., second peaking amplifier 106, 206, 306). Likewise, graph 708 shows the command voltage phase variation for both the first peaking amplifier and the second peaking amplifier. In these graphs the first peaking amplifier has an expanded phase (i.e., AM/PM) response, while the second peaking amplifier as a phase-lagged AM/PM response.

Such a configuration can again be implemented to reduce the phase error in the current combination of the first peaking amplifier and carrier amplifier at the combining node. Such an implementation can also provide further reduced variation in the output of the second peaking amplifier, thus keeping the output current of the second peaking amplifier in its operating power range. This phase expanded response could also provide a more improved current combination, power and efficiency, again expressed as less distorted AM/AM and AM/PM characteristics.

Figure 8:
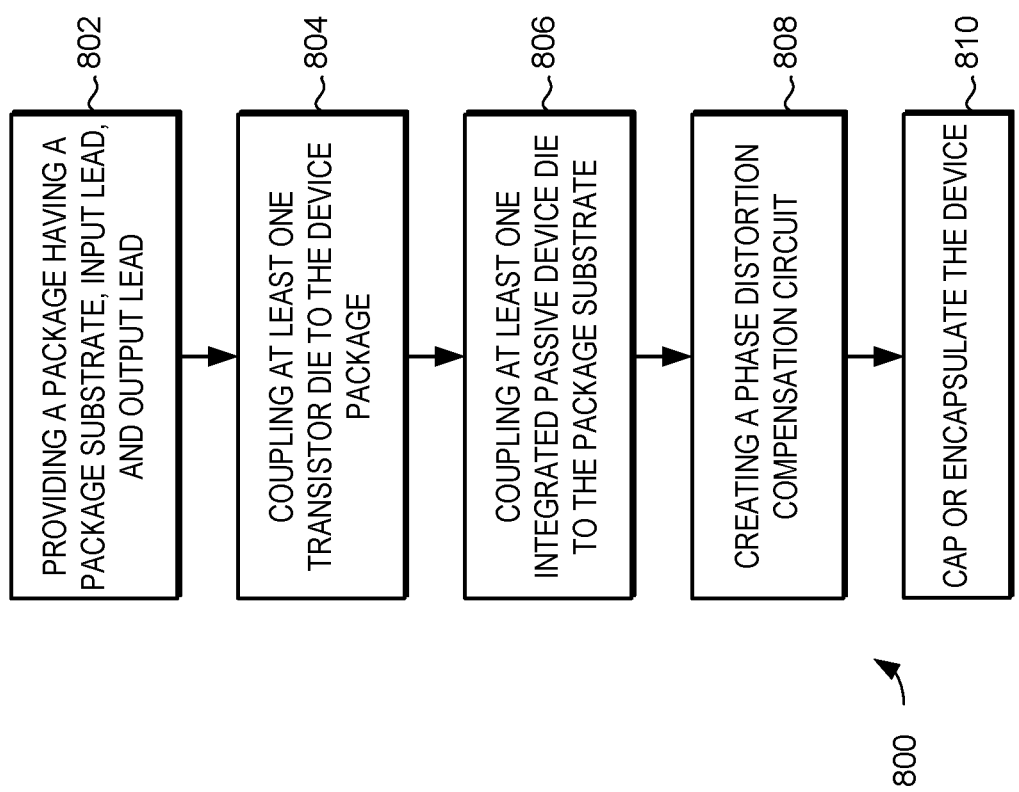
FIG. 8 is a flowchart of a method for fabricating a packaged Doherty amplifier device in accordance with an example embodiment.

Turning now to FIG. 8, a flowchart illustrates a method 800 for fabricating a packaged RF power amplifier device (e.g., Doherty amplifier 100, 200, 300) that includes a phase distortion compensation circuit (e.g. phase distortion compensation circuits 108, 208, 308). In accordance with the embodiments described herein, the phase distortion compensation circuit is coupled to the inputs of both the first peaking amplifier (e.g., first peaking amplifier 104, 204, 304) and the second peaking amplifier (e.g., second peaking amplifier 106, 206, 306). In general, this phase distortion compensation circuit is configured to compensate for input impedance variations in the first peaking amplifier and the second peaking amplifier.

The phase distortion compensation circuit is implemented to include resistive, inductive and capacitive elements that define a Pi-network (e.g., Pi-network 322, FIGS. 3A and 3B) and a control load circuit (e.g., control load circuit 324). At least some of these resistive, inductive, and capacitive elements may be implemented with integrated devices, including integrated passive devices (IPDs) and mounted inside the package with the transistors and other elements of the amplifier. In such implementations the phase distortion compensation circuit may provide the Doherty amplifier with good performance over a relatively wide bandwidth.

The method 800 may begin, in block 802, by providing a package having a package substrate, one or more input leads, and one or more output leads (e.g., package 502, package substrate 503, input leads 504, output leads 506). In block 804 at least one transistor die (e.g., transistor dies 510) is coupled to the device package. This coupling can be accomplished by affixing the transistor die to package substrate using conductive epoxy, solder, solder bumps, sintering, and/or eutectic bonds, to give non-limiting examples.

In block 806 at least one integrated passive device die (e.g., IPD dies 512, 514) is coupled to the device substrate between the transistor die and the input and output leads. As described above, the IPD dies include integrated passive devices, such as integrated MIM capacitors and spiral inductors.

In block 808 a phase distortion compensation circuit is created by connecting the inductive elements and capacitive elements. As described above, bondwires can be used to provide electrical connections between the integrated capacitive elements, the transistor, and the package leads. When so implemented, these bondwires also provide at least some of the inductive elements of the phase distortion compensation circuit.

In block 810 the device is capped (e.g., for an air cavity package) or encapsulated (e.g., with mold compound for an overmolded package). The resulting packaged amplifier device may then be incorporated into a larger electrical system.

In one embodiment, a Doherty amplifier device is provided, comprising: a carrier amplifier, the carrier amplifier including a carrier amplifier input and a carrier amplifier output; a first peaking amplifier, the first peaking amplifier including a first peaking amplifier input and a first peaking amplifier output, the first peaking amplifier further including a first intrinsic input capacitance; a second peaking amplifier, the second peaking amplifier including a second peaking amplifier input and a second peaking amplifier output, the second peaking amplifier further including a second intrinsic input capacitance; and a phase distortion compensation circuit, the phase distortion compensation circuit comprising: a Pi-network coupled between the first peaking amplifier input and the second peaking amplifier input, the Pi-network including a first shunt inductance in parallel with the first intrinsic input capacitance and a second shunt inductance in parallel with the second intrinsic input capacitance, and further comprising a first phase shift inductance coupled between the first shunt inductance and the second shunt inductance; and a control load circuit coupled to the Pi-network.

In another embodiment, a method of manufacturing a Doherty amplifier device is provided, the method comprising the steps of: coupling at least a first input lead to a package substrate; coupling a at least a first output lead to the package substrate; coupling at least one transistor die to the package substrate, wherein the at least one transistor die includes a carrier amplifier, a first peaking amplifier, and a second peaking amplifier, the first peaking amplifier including a first peaking amplifier input and a first intrinsic input capacitance, and the second peaking amplifier including a second peaking amplifier input and a second intrinsic input capacitance; coupling at least one integrated passive device die to the package substrate between the at least one transistor die and the at least one first input lead, wherein the integrated passive device die includes one or more integrally formed integrated passive devices; and coupling a phase distortion compensation circuit to the first peaking amplifier and the second peaking amplifier, the phase distortion compensation circuit including: a Pi-network coupled between the first peaking amplifier input and the second peaking amplifier input, the Pi-network including a first shunt inductance in parallel with the first intrinsic input capacitance, and a second shunt inductance in parallel with the second intrinsic input capacitance, and further comprising a first phase shift inductance coupled between the first shunt inductance and the second shunt inductance; and a control load circuit coupled to the Pi-network.

In another embodiment, a Doherty amplifier device is provided, comprising: a device package including an output lead and at least one input lead, the device package encasing: a carrier amplifier, the carrier amplifier including a carrier amplifier input and a carrier amplifier output; a first peaking amplifier, the first peaking amplifier including a first peaking amplifier input and a first peaking amplifier output, the first peaking amplifier further including a first intrinsic input capacitance; a second peaking amplifier, the second peaking amplifier including a second peaking amplifier input and a second peaking amplifier output, the second peaking amplifier further including a second intrinsic input capacitance; a first input phase shifter coupled between the carrier amplifier input and the first peaking amplifier input; and a phase distortion compensation circuit, the phase distortion compensation circuit comprising: a Pi-network coupled between the first peaking amplifier input and the second peaking amplifier input, the Pi-network including a first shunt inductance in parallel with the first intrinsic input capacitance, and a second shunt inductance in parallel with the second intrinsic input capacitance, and further comprising a first phase shift inductance coupled between the first shunt inductance and the second shunt inductance, and further comprising a first blocking capacitor coupled to the first shunt inductance, and a second blocking capacitor coupled to the second shunt inductance; and a control load circuit coupled to the Pi-network.

Various modifications may be made to the above-described and illustrated embodiments without departing from the scope of the inventive subject matter. For example, although conventional Doherty amplifier implementations are discussed above (e.g., in which a 90 degree phase delay is applied to the input peaking signal prior to amplification, and a corresponding 90 degree phase delay is applied to the output carrier signal after amplification to ensure that the amplified carrier and peaking signals are combined in phase), other embodiments may include an "inverted" Doherty amplifier implementation (e.g., in which a 90 degree phase delay is applied to the input carrier signal prior to amplification, and a corresponding 90 degree phase delay is applied to the output peaking signal after amplification). Further, as mentioned above, embodiments include single-stage and multiple-stage amplifiers. Also, the main and peaking transistors, the input integrated passive device (IPD), and the output integrated passive device may be implemented on separate die or on the same die, in various embodiments.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematics shown in the figures depict several exemplary arrangements of elements, additional intervening elements, devices, features, or components may be present in other embodiments of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A Doherty amplifier device comprising:
a carrier amplifier, the carrier amplifier including a carrier amplifier input and a carrier amplifier output;
a first peaking amplifier, the first peaking amplifier including a first peaking amplifier input and a first peaking amplifier output, the first peaking amplifier further including a first intrinsic input capacitance;
a second peaking amplifier, the second peaking amplifier including a second peaking amplifier input and a second peaking amplifier output, the second peaking amplifier further including a second intrinsic input capacitance; and
a phase distortion compensation circuit, the phase distortion compensation circuit comprising:

a Pi-network coupled between the first peaking amplifier input and the second peaking amplifier input, the Pi-network including a first shunt inductance in parallel with the first intrinsic input capacitance and a second shunt inductance in parallel with the second intrinsic input capacitance, and further comprising a first phase shift inductance coupled between the first shunt inductance and the second shunt inductance; and a control load circuit coupled to the Pi-network, wherein the control load circuit includes a resistor coupled between the Pi-network and a ground reference node.

2. The Doherty amplifier device of claim 1, wherein the Pi-network further includes a first blocking capacitor coupled to the first shunt inductance, and a second blocking capacitor coupled to the second shunt inductance.

3. The Doherty amplifier device of claim 2, further comprising a device package, and wherein the first shunt inductance, the second shunt inductance, the first blocking capacitor, and the second blocking capacitor are formed as integrated passive devices (IPD) on at least one IPD die, and wherein the IPD die is mounted inside the device package with the first peaking amplifier and the second peaking amplifier.

4. The Doherty amplifier device of claim 1, wherein the Pi-network includes the first intrinsic input capacitance and the second intrinsic input capacitance.

5. The Doherty amplifier device of claim 1, wherein the Pi-network provides a phase pre-distortion between the first peaking amplifier and the second peaking amplifier.

6. The Doherty amplifier device of claim 1, wherein the Pi-network provides a phase-constant impedance match network over a specified bandwidth.

7. The Doherty amplifier device of claim 1, wherein the Pi-network provides a phase-expansion impedance match network over a specified bandwidth.

8. The Doherty amplifier device of claim 1, further comprising a first input phase shifter coupled between the carrier amplifier input and the first peaking amplifier input, wherein the first input phase shifter provides a first 90 degree phase shift for signals applied to the first peaking amplifier, and wherein the first phase shift inductance provides an additional 90 degree phase shift to signals applied to the second peaking amplifier.

9. A Doherty amplifier device comprising:
a carrier amplifier, the carrier amplifier including a carrier amplifier input and a carrier amplifier output;
a first peaking amplifier, the first peaking amplifier including a first peaking amplifier input and a first peaking amplifier output, the first peaking amplifier further including a first intrinsic input capacitance;
a second peaking amplifier, the second peaking amplifier including a second peaking amplifier input and a second peaking amplifier output, the second peaking amplifier further including a second intrinsic input capacitance; and
a phase distortion compensation circuit, the phase distortion compensation circuit comprising:
a Pi-network coupled between the first peaking amplifier input and the second peaking amplifier input, the Pi-network including a first shunt inductance in parallel with the first intrinsic input capacitance and a second shunt inductance in parallel with the second intrinsic input capacitance, and further comprising a first phase shift inductance coupled between the first shunt inductance and the second shunt inductance; and a control load circuit coupled to the Pi-network, wherein the control load circuit comprises a ground reference node and at least one of an L-network coupled to the ground reference node, a T-network coupled to the ground reference node, a high pass T-network coupled to the ground reference node, and a second Pi-network coupled to the ground reference node.

10. A method of manufacturing a Doherty amplifier device, the method comprising:
coupling at least a first input lead to a package substrate;
coupling a at least a first output lead to the package substrate;
coupling at least one transistor die to the package substrate, wherein the at least one transistor die includes a carrier amplifier, a first peaking amplifier, and a second peaking amplifier, the first peaking amplifier including a first peaking amplifier input and a first intrinsic input capacitance, and the second peaking amplifier including a second peaking amplifier input and a second intrinsic input capacitance;
coupling at least one integrated passive device die to the package substrate between the at least one transistor die and the at least one first input lead, wherein the integrated passive device die includes one or more integrally formed integrated passive devices; and
coupling a phase distortion compensation circuit to the first peaking amplifier and the second peaking amplifier, the phase distortion compensation circuit including:
a Pi-network coupled between the first peaking amplifier input and the second peaking amplifier input, the Pi-network including a first shunt inductance in parallel with the first intrinsic input capacitance, and a second shunt inductance in parallel with the second intrinsic input capacitance, and further comprising a first phase shift inductance coupled between the first shunt inductance and the second shunt inductance; and
a control load circuit coupled to the Pi-network, wherein the control load circuit includes a resistor coupled between the Pi-network and a ground reference node.

11. The method of claim 10, wherein the Pi-network further includes a first blocking capacitor coupled to the first shunt inductance, and a second blocking capacitor coupled to the second shunt inductance.

12. The method of claim 11, wherein the first shunt inductance, the second shunt inductance, the first blocking capacitor, and the second blocking capacitor are formed as integrated passive devices on the at least one integrated passive device die.

13. The method of claim 10, wherein the Pi-network includes the first intrinsic input capacitance and the second intrinsic input capacitance.

14. The method of claim 10, wherein the first phase shift inductance provides a 90 degree phase shift to signals applied to the second peaking amplifier.

15. The Doherty amplifier device of claim 1, wherein the control load circuit comprises:
a first capacitor and a second capacitor coupled in series with the resistor between the Pi-network and the ground reference node; and
an inductor coupled between the ground reference node and a connection node between the first and second capacitors.

16. The Doherty amplifier device of claim 1, wherein the control load circuit comprises:

a first inductor coupled in series with the resistor between the Pi-network and the ground reference node.

17. The Doherty amplifier device of claim 16, wherein the control load circuit further comprises:
a second inductor coupled in series with the first inductor and the resistor between the Pi-network and the ground reference node; and
a shunt capacitor coupled between the ground reference node and a connection node between the first and second inductors.

18. The Doherty amplifier device of claim 16, wherein the control load circuit further comprises:
a first shunt capacitor coupled between the Pi-network and the ground reference node; and
a second shunt capacitor coupled between the ground reference node and a connection node between the first inductor and the resistor.

* * * * *